(12) United States Patent
Mustafi et al.

(10) Patent No.: US 11,405,030 B1
(45) Date of Patent: Aug. 2, 2022

(54) CASCODE BIAS FOR COMPARATOR

(71) Applicant: TEXAS INSTRUMENTS INCORPORATED, Dallas, TX (US)

(72) Inventors: Manish Mustafi, Bangalore (IN); Amal Kumar Kundu, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/406,583

(22) Filed: Aug. 19, 2021

(51) Int. Cl.
*H03K 5/24* (2006.01)
*H03F 3/45* (2006.01)

(52) U.S. Cl.
CPC ....... *H03K 5/2481* (2013.01); *H03F 3/45224* (2013.01); *H03F 3/45269* (2013.01)

(58) Field of Classification Search
CPC .............. H03K 5/2481; H03F 3/45224; H03F 3/45228; H03F 3/45233; H03F 3/45269; G11C 7/062
See application file for complete search history.

(56) References Cited

U.S. PATENT DOCUMENTS 7,372,307 B1 * 5/2008 Wu .................. G01R 19/16552
327/89

\* cited by examiner

*Primary Examiner* — Jung Kim
(74) *Attorney, Agent, or Firm* — Mark A. Valetti; Charles A. Brill; Frank D. Cimino

(57) ABSTRACT

A comparator having: a first transistor coupled to a first input terminal; a first current source coupled to the first transistor; a second transistor coupled to a second input terminal and coupled to the first current source; a third transistor coupled in series with the first transistor; a fourth transistor coupled in series with the second transistor; a fifth transistor coupled in series with the first transistor; a sixth transistor coupled in series with the second transistor; a seventh transistor coupled to the first input terminal and coupled as a source follower to the fifth transistor; and an eighth transistor coupled to the second input terminal and coupled as a source follower to the sixth transistor. The comparator also including a differential amplifier coupled to the first output terminal and coupled to the second output terminal.

20 Claims, 1 Drawing Sheet

CASCODE BIAS FOR COMPARATOR

TECHNICAL FIELD

This relates generally to analog circuit design, and in more particular examples to cascode biasing for a comparator.

BACKGROUND

A comparator is a device that compares two input voltages and provides an output indicating which of the input voltages is higher or lower. Its operation is a hybrid of analog and digital operation in that it receives and compares analog inputs, but provides a digital output indicating which of the analog inputs is greater. In some examples, this digital output is used by other digital circuitry to make operational judgments. For example, one input to a comparator may be from a measuring device in a vehicle. The other input may be a reference voltage. If the voltage from the measuring device goes higher than the reference voltage, the comparator output indicates this change, and a warning light may be illuminated to indicate that the parameter (e.g., engine temperature) is greater than it should be.

An important characteristic of a comparator is the capability to compare a wide range of voltages. Between the voltage supply (Vdd) and an input, there are often a number of components that require a certain voltage drop to operate. For example, if the headroom requirement of a comparator is three volts and Vdd is 10 volts, then the comparator cannot reliably compare voltages above seven volts. It is desirable for a comparator to be capable of operation over a wide range of supply voltages to meet varying customer needs. If the customer has a design with a 5-volt supply, three volts of headroom leaves very little room for the comparison input voltages. It is desirable for the operating range of the comparator to be as wide as possible.

SUMMARY

In accordance with an example, a comparator includes a first transistor having a first control terminal coupled to a first input terminal, a first current handling terminal and second current handling terminal; a first current source having a first terminal coupled to a supply potential and a second terminal coupled to the first current handling terminal; and a second transistor having a second control terminal coupled to a second input terminal, a third current handling terminal coupled to the second terminal, and a fourth current handling terminal. The comparator also includes a third transistor having a third control terminal coupled to the first input terminal, a fifth current handling terminal coupled to the second current handling terminal, and a sixth current handling terminal coupled to a first output terminal; a fourth transistor having a fourth control terminal coupled to the second input terminal, a seventh current handling terminal coupled to the fourth current handling terminal, and an eighth current handling terminal coupled to a second output terminal; and a fifth transistor having a fifth control terminal, a ninth current handling terminal coupled to the second current handling terminal, and a tenth handling terminal coupled to the first output terminal. The comparator also includes a sixth transistor having an sixth control terminal, an eleventh current handling terminal coupled to the fourth current handling terminal, and a twelfth current handling terminal coupled to the second output terminal; a seventh transistor having a seventh control terminal coupled to the first input terminal, a thirteenth current handling terminal coupled to the supply potential and a fourteenth current handling terminal coupled to the fifth control terminal; and an eighth transistor having an eighth control terminal coupled to the second input terminal, a fifteenth current handling terminal coupled to the supply potential and a sixteenth current handling terminal coupled to the sixth control terminal. The comparator also includes a second current source having a third terminal coupled to the fifth control terminal and a fourth terminal coupled to a reference potential; and a third current source having a fifth terminal coupled to the sixth control terminal and a sixth terminal coupled to the reference potential. The comparator also includes a differential amplifier having a non-inverting input terminal coupled to the first output terminal and an inverting input terminal coupled to the second output terminal, the differential amplifier configured to provide a first output signal output on a third output terminal when a first voltage on the non-inverting input terminal is greater than a second voltage on the inverting input terminal, and configured to provide a second output signal on the third output terminal when the first voltage on the non-inverting input terminal is greater than the second voltage on the inverting input terminal.

DETAILED DESCRIPTION

Figure 1:
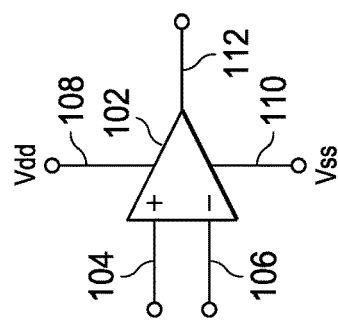
FIG. 1 is a schematic drawing of a comparator.

In the drawings, corresponding numerals and symbols generally refer to corresponding parts unless otherwise indicated. The drawings are not necessarily drawn to scale.

In example arrangements, the problem of extending the input range of a comparator is solved by providing two cascode transistors in each of two comparison paths. One cascode transistor couples to the input comparison voltages. The other cascode transistor couples to the input comparison voltages via a source follower amplifier that begins providing a level shifted input signal to the second cascode transistor after a threshold voltage.

FIG. 1 is a schematic drawing of a comparator 102. One power supply potential (Vdd) couples to first power supply input 108. Another power supply potential (Vss) couples to second power supply input 110. In this example, Vss is a reference potential, such as ground or zero volts. Positive (non-inverting) input 104 receives one input for comparison. Negative (inverting) input 106 receives the other input for comparison. If the voltage on positive input 104 is greater than the voltage on negative input 106, a positive voltage (Vdd) is output on output 112. If the voltage on positive input 104 is less than the voltage on negative input 106, a negative or approximately zero voltage (Vss) is output on output 112. In this example, Vdd is in the range of 2.2 to 40 volts and input voltages can vary from zero to 40 volts. In some configurations, the output on output 112 is the inverse. That is, the voltage on output 112 is Vss if positive input 104 is greater than negative input 106, and the voltage on output 112 is Vdd if positive input 104 is less than negative input 106.

Figure 2:
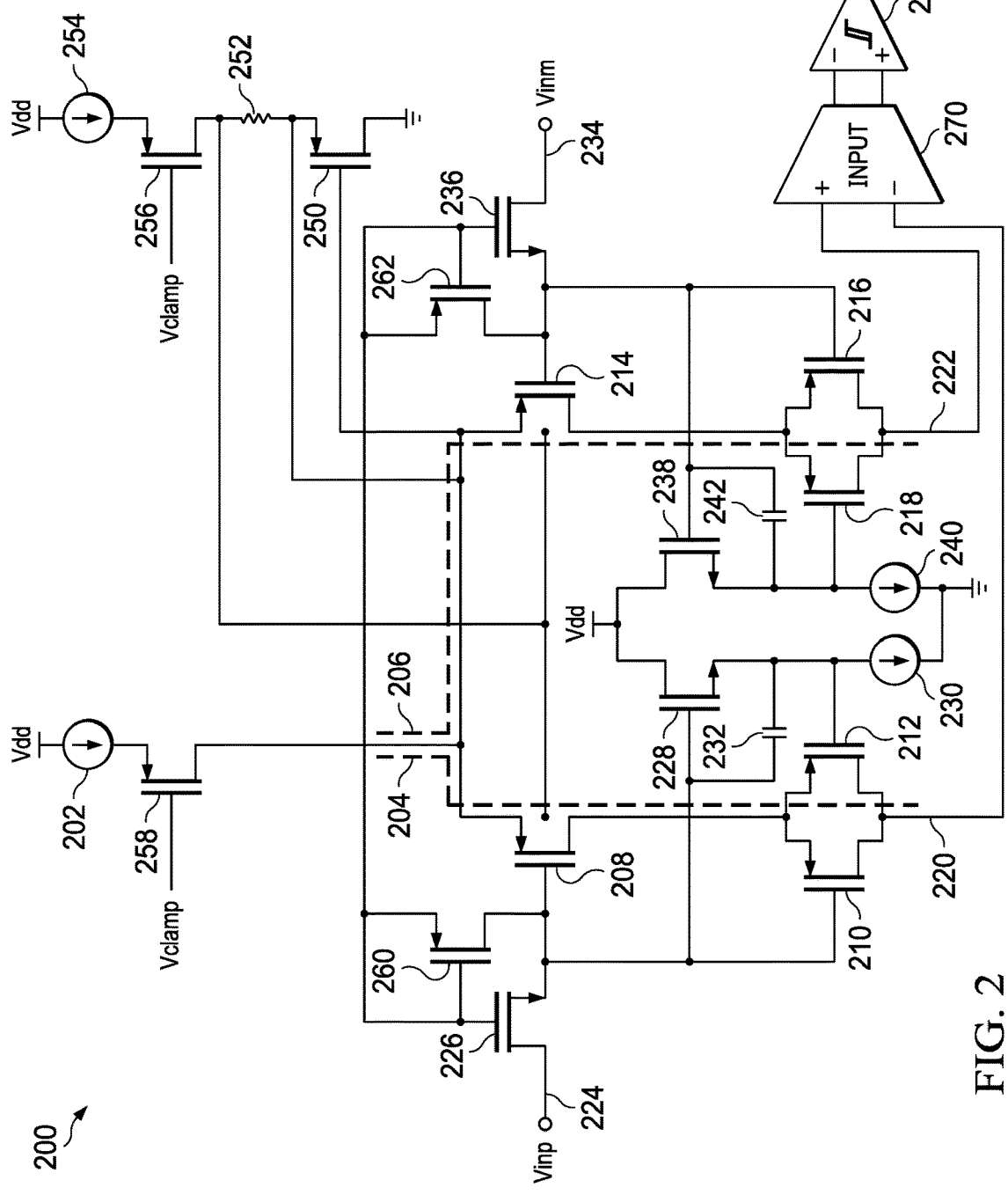
FIG. 2 is a schematic diagram of an example comparator.
The same reference number or other reference designators are used in the drawings to designate the same or similar (functionally and/or structurally) features.

FIG. 2 is a schematic diagram of an example comparator 200. In various examples, comparator 200 is: (i) integrated on a monolithic integrated circuit; (ii) comprised of discrete components; or (iii) a hybrid of discreet and integrated components. With reference to FIGS. 1 and 2, positive input 104 of FIG. 1 is equivalent to first input terminal 224 in FIG. 2 and negative input 106 in FIG. 1 is equivalent to second input terminal 234 in FIG. 2. First power supply input 108 of FIG. 1 is shown as supply rail Vdd in FIG. 2 and second power supply input 110 in FIG. 1 is shown as ground or Vss in FIG. 2. Output 112 of FIG. 1 is shown as output 282 in FIG. 2.

In operation, current from first current source 202 flows through eleventh transistor 258 (which is normally on unless a voltage spike raises its drain above Vclamp) and then through first path 204 and second path 206. This current is divided between first path 204 and second path 206 based the relative impedance of the two paths. The relative impedance of the two paths is determined by the values of input voltages Vinp and Vinm. That is, the impedances of these two paths are determined by the relative voltages on first input terminal 224 and second input terminal 234. If voltage on first input terminal 224 is less than that on second input terminal 234, the impedance of first path 204 will be lower than that of second path 206. If voltage on first input terminal 224 is greater than that on second input terminal 234, the impedance of first path 204 will be higher than that of second path 206. If first path 204 has less impedance than that of second path 206, more of the current from first current source 202 will flow through first path 204, and through the input impedance of the negative input of input buffer 270. Thus, a higher voltage will be present across the negative input impedance of input buffer 270. On the other hand, if voltage on first input terminal 224 is greater than that on second input terminal 234, then impedance of first path 204 will be higher than that of second path 206 and more of the current from first current source 202 flows through second path 206, and through the input impedance of the positive input of input buffer 270. Thus, a higher voltage will be present across the input impedance of the positive input of input buffer 270.

The voltage at the positive input of input buffer 270 is passed to the negative input of Schmitt trigger differential amplifier 272. The voltage at the negative input of input buffer 270 is passed to the positive input of Schmitt trigger differential amplifier 272. A Schmitt trigger differential amplifier is used in this example to provide signal stability. If the input voltages are close and noisy (i.e., fluctuate rapidly within a range), the output of a normal differential amplifier may rapidly flip back and forth. This is avoided in a Schmitt trigger differential amplifier, which operates as follows.

If the voltage on the positive input of Schmitt trigger differential amplifier 272 is greater than the voltage at the negative input of Schmitt trigger differential amplifier 272, then Schmitt trigger differential amplifier 272 outputs a "one" or "high" output (approximately Vdd). If the voltage on the positive input of Schmitt trigger differential amplifier 272 is less than the voltage at the negative input of Schmitt trigger differential amplifier 272, then Schmitt trigger differential amplifier 272 outputs a "zero" or "low" output (approximately Vss, ground or a voltage that is applied to the amplifier's lower supply rail). A Schmitt trigger differential amplifier includes a hysteresis function that only changes output after a threshold difference between the input voltages is detected. For example, if the positive input is greater than the negative input, Schmitt trigger differential amplifier 272 outputs a "one." For the output of the Schmitt trigger amplifier to switch to a "zero" output, the voltage on the negative input must be greater than the voltage on the positive input by at least the threshold voltage of the trigger. Conversely, for the output of the Schmitt trigger amplifier to switch from a "zero" output to a "one" output, the voltage on the positive input must be greater than the voltage on the negative input by at least the threshold voltage of the trigger. In an example, this threshold voltage is between 500 µV and 10 mV. In another example, input buffer 270 and Schmitt trigger differential amplifier 272 are combined into one unit with the inputs of the Schmitt trigger differential amplifier 272 having the impedance of the input buffer 270, and thus first output terminal 220 and second output terminal 222 couple directly to Schmitt trigger differential amplifier 272. In yet another example, Schmitt trigger differential amplifier 272 does not include the Schmitt trigger functionality and is thus a simple differential amplifier. This example would be more susceptible to noise, but that may be acceptable in some applications.

The output from the Schmitt trigger differential amplifier is applied by driver 274 and driver 276 to the gates of first output transistor 278 and second output transistor 280, respectively. First output transistor 278 and second output transistor 280 form an inverting push-pull complementary metal-oxide-semiconductor (CMOS) amplifier that provides the inverse of the output of Schmitt trigger differential amplifier 272 on output 282.

First switch 226 and second switch 236 are normally conductive or "on." First switch 226 and second switch 236 are normally biased "on" by the voltage on the source of ninth transistor 250. First diode-connected transistor 260 and second diode-connected transistor 262 are implemented using p-channel metal-oxide-semiconductor field effect transistors (pMOSFETs) whereby the gate of each transistor is shorted to the source of the respective transistor and are normally reverse biased because the voltage at the source of ninth transistor 250 is normally higher than Vinp and Vimn. The "cathode" of first diode-connected transistor 260 and second diode-connected transistor 262 couple to source of ninth transistor 250. The "anode" of first diode-connected transistor 260 couples to the gate of first transistor 208. The "anode" of second diode-connected transistor 262 couples to the gate of second transistor 214.

The "cathode" of first diode-connected transistor 260 and second diode-connected transistor 262 are held at 2 volts above the lowest of input voltages Vinp and Vinm. For example, if Vinm is lower than Vinp, the voltage at the "cathodes" of first diode-connected transistor 260 and second diode-connected transistor 262 is then set at Vinm plus the threshold voltage of second transistor 214 plus the threshold voltage of ninth transistor 250. The threshold voltage of these transistors is approximately 1 volt. Therefore, the "cathode" of first diode-connected transistor 260 is at 2 volts above Vinm. If Vinp is more than 2 volts greater than Vinm, the first switch 226 will be "off". First diode-connected transistor 260 may be forward biased, and thus the gate of first transistor 208 is clamped to no more than the voltage at the source of ninth transistor 250 plus the threshold of first diode-connected transistor 260. In summary, if voltage on first input terminal 224 goes more than 2 volts above second input terminal 234, first diode-connected transistor 260 will clamp the gate of first transistor 208 at 2 volts above Vinm plus the threshold of first diode-connected transistor 260. Conversely, if voltage on second input terminal 234 is more than 2 volts above first input terminal 224, the second switch 236 will be "off" and the gate of second transistor 214 will be clamped at 2 volts above Vinp plus the threshold of second diode-connected transistor 262. In either case, the path with the higher voltage will have a higher impedance.

In this example, first switch 226 and second switch 236 are drain-extended metal-oxide-semiconductor field effect (DEMOS) transistors (also known as extended drain transistors). Specifically, first switch 226 and second switch 236 are n-type DEMOS devices (nDEMOS). The extended drains of first switch 226 and second switch 236 couple to first input terminal 224 and second input terminal 234, respectively, to protect the circuit from over voltage stress. In addition, limiting the applied voltage differential between Vinp and Vinm limits the stress on the transistors that comprise first path 204 and second path 206.

First path 204 includes first transistor 208, third transistor 210, and fifth transistor 212. Second path 206 includes second transistor 214, fourth transistor 216 and sixth transistor 218. The third transistor 210, fourth transistor 216, fifth transistor 212, and sixth transistor 218 are each cascode transistors. First input terminal 224 (Vinp) couples to the gates (control terminals) of first transistor 208, third transistor 210 and seventh transistor 228 through first switch 226. In this example, seventh transistor 228, and eighth transistor 238 are n-channel metal-oxide-semiconductor field effect transistors (nMOSFETs). First transistor 208 is a pMOSFET. Third transistor 210, fifth transistor 212, fourth transistor 216, sixth transistor 218, ninth transistor 250, tenth transistor 256 and eleventh transistor 258 are p-type DEMOS (pDEMOS) transistors. The source (current handling terminal) of seventh transistor 228 couples to the gate of fifth transistor 212. The drain (current handling terminal) of seventh transistor 228 couples to Vdd, thus seventh transistor 228 has a source follower configuration that provides a level-shifting function. That is, seventh transistor 228 only becomes active when Vinp is greater than one threshold voltage (approximately one volt) above ground. At this level of Vinp, third transistor 210 is off or nearly off, thus fifth transistor 212 provides the cascode function at this input voltage level. Second current source 230 biases the source of seventh transistor 228. First capacitor 232 couples across the gate and source of seventh transistor 228. The capacitance of first capacitor 232 is on the order of 200-300 pF in some example embodiments. When the voltage on first input terminal 224 changes quickly, first capacitor 232 passes a quick pulse to the gate of fifth transistor 212 to provide for very quick response of fifth transistor 212 until seventh transistor 228 has time to catch up.

Second input terminal 234 (Vinm) couples to the gate of second transistor 214 and fourth transistor 216 through second switch 236. In addition, second input terminal 234 couples to the gate of eighth transistor 238. The source of eighth transistor 238 couples to the gate of sixth transistor 218. The drain of eighth transistor 238 couples to Vdd, thus eighth transistor 238 has a source follower configuration that provides a level shifting function like that of seventh transistor 228. Third current source 240 biases the source of eighth transistor 238. Second capacitor 242 couples across the gate and source of eighth transistor 238. The capacitance of second capacitor 242 is on the order of 200-300 pF in some example embodiments. When the voltage on second input terminal 234 changes quickly, second capacitor 242 passes a quick pulse to the gate of sixth transistor 218 to provide for very quick response of sixth transistor 218 to provide for very quick response of sixth transistor 218 until eighth transistor 238 has time to catch up.

Because first path 204 and second path 206 are mirror images of each other, the following discussion, which refers to first path 204, is equally applicable to second path 206. Third transistor 210 and fifth transistor 212 are drain-extended MOS (DEMOS) transistors with their drains coupled to first output terminal 220, which couples to the negative input of input buffer 270. When the voltage on first input terminal 224 (Vinp) goes below ground, seventh transistor 228 (n-channel transistor) turns "off" as its gate voltage goes below its source voltage, which is clamped at ground through second current source 230. However, the gate of third transistor 210 (p-channel) is pulled below ground (thereby turning it "on"). Thus, third transistor 210 takes part of the current for first path 204 to support the comparison process. However, because third transistor 210 pulls the source of fifth transistor 212 near or below ground, the gate to source voltage of fifth transistor 212 is below a threshold voltage and the impedance of fifth transistor 212 remains high until Vinp goes one threshold above ground causing seventh transistor 228 to conduct. Because the impedance of fifth transistor 212 is high in this range, only the change of impedance of first transistor 208 and third transistor 210 affects the comparison in this range.

As Vinp rises to the threshold voltage of seventh transistor 228, seventh transistor 228 begins to turn on. The gate of fifth transistor 212 is below Vinp by the threshold voltage of seventh transistor 228. Thus, fifth transistor 212 will turn "on" and third transistor 210 will turn "off" (as its gate voltage is higher than that of fifth transistor 212). Therefore, the comparison process is supported by fifth transistor 212 after Vinp rises above the threshold voltage of seventh transistor 228. In this example, the threshold voltage of seventh transistor 228 is approximately 1 volt.

In the example of comparator 200, the threshold voltage of first transistor 208 and second transistor 214 are increased from approximately 700 mV to 1.1 volts by the circuit including ninth transistor 250, resistor 252, tenth transistor 256, and fourth current source 254. As noted above, the voltage on the gate of ninth transistor 250 is one threshold voltage (approximately 1 volts) above the lower of Vinp or Vinm. In operation, current from fourth current source 254 flows through tenth transistor 256 (which is normally on unless a voltage spike raises its drain above Vclamp). Thus, the current through ninth transistor 250 is fixed and the voltage drop across resistor 252 is fixed at about 2 volts. This voltage is applied to the body connection of first transistor 208 and second transistor 214. When the lower of Vinp or Vinm is low (e.g., less than one threshold voltage), the sources of first transistor 208 and second transistor 214 are one threshold above the lower of Vinp and Vinm. Thus, a high body bias voltage between the body bias contacts (coupled to the drain of tenth transistor 256) of first transistor 208 and second transistor 214 and the sources of first transistor 208 and second transistor 214, respectively, raises the threshold voltage of first transistor 208 and second transistor 214 to approximately 1.1 volts. When the lower of Vinp or Vinm is high (near Vdd), the drain of tenth transistor 256 will not go above one threshold voltage below Vdd because Vdd drives current source 254, and thus the output voltage of current source 254 can be no higher than Vdd. Therefore, a low body bias voltage between the body bias contacts of first transistor 208 and second transistor 214 and the sources of first transistor 208 and second transistor 214, respectively, lowers the threshold voltage of first transistor 208 and second transistor 214 to approximately 0.7 volts. Thus, at low input voltages, the threshold voltage of first transistor 208 and second transistor 214 is raised, which helps to keep these transistors in their saturation range at low voltages. At high input voltages, the threshold voltage of first transistor 208 and second transistor 214 is lowered, but seventh transistor 228 and eighth transistor 238 are biased with level shifting source followers to provide greater headroom for first transistor 208 and second transistor 214, respectively.

However, even at low voltages, a body bias is applied to first transistor 208 and second transistor 214. When Vinp or Vinm is less than the ground voltage, current flows through the third transistor 210, and fifth transistor 212 is turned "off" because seventh transistor 228 is off. If the threshold voltage of the third transistor 210 is more than that of first transistor 208, then first transistor 208 will operate in its linear region, losing the expected gain from this stage. The body bias circuit keeps the body terminal of first transistor 208 at a higher voltage. Higher body bias effectively increases the threshold voltage of first transistor 208 providing sufficient headroom for it to operate in its saturation region.

In summary, the use of dual cascode transistors with one of the dual cascode transistors having a level-shifted input raises the input voltage range where effective comparison can be achieved. Including a back-bias system that raises the threshold of the primary transistors (i.e. first transistor 208 and second transistor 214) further increases the effective range of the example comparator of FIG. 2.

The term "couple" is used herein. The term may cover connections, communications, or signal paths that enable a functional relationship consistent with this description. For example, if device A provides a signal to device B to perform an action, in a first example device A couples to device B, or in a second example device A couples to device B through intervening component C if intervening component C does not substantially alter the functional relationship between device A and device B such that device B is performs the action in response to device A via the signal provided by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device, or other electronics or semiconductor component.

A circuit or device that is described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors is described herein, other transistors (or equivalent devices) may be used instead. For example, a p-type metal-oxide-silicon FET ("MOSFET") may be used in place of an n-type MOSFET with little or no changes to the circuit. Furthermore, other types of transistors may be used (such as bipolar junction transistors (BJTs)), drain-extended MOSFETs (p-type or n-type) or other types of junction transistor and/or field effect transistors.

Circuits described herein are reconfigurable to include the replaced components to provide functionality at least partially similar to functionality available prior to the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. Unless otherwise stated, "about," "approximately," or "substantially" preceding a value means +/−10 percent of the stated value. Modifications are possible in the described examples, and other examples are possible within the scope of the claims.

What is claimed is:

1. A comparator comprising:
    a first transistor having a first control terminal coupled to a first input terminal, a first current handling terminal and a second current handling terminal;
    a first current source having a first terminal adapted to be coupled to a supply potential and a second terminal coupled to the first current handling terminal;
    a second transistor having a second control terminal coupled to a second input terminal, a third current handling terminal coupled to the first current handling terminal and a fourth current handling terminal;
    a third transistor having a third control terminal coupled to the first input terminal, a fifth current handling terminal coupled to the second current handling terminal, and a sixth current handling terminal coupled to a first output terminal;
    a fourth transistor having a fourth control terminal coupled to the second input terminal, a seventh current handling terminal coupled to the fourth current handling terminal, and an eighth current handling terminal coupled to a second output terminal;
    a fifth transistor having a fifth control terminal, a ninth current handling terminal coupled to the second current handling terminal and a tenth handling terminal coupled to the first output terminal;
    a sixth transistor having a sixth control terminal, an eleventh current handling terminal coupled to the fourth current handling terminal and a twelfth current handling terminal coupled to the second output terminal;
    a seventh transistor having a seventh control terminal coupled to the first input terminal, a thirteenth current handling terminal adapted to be coupled to the supply potential and a fourteenth current handling terminal coupled to the fifth control terminal;
an eighth transistor having an eighth control terminal coupled to the second input terminal, a fifteenth current handling terminal adapted to be coupled to the supply potential and a sixteenth current handling terminal coupled to the sixth control terminal;
a second current source having a third terminal coupled to the fifth control terminal and a fourth terminal coupled to a reference potential;
a third current source having a fifth terminal coupled to the sixth control terminal and a sixth terminal coupled to the reference potential; and
a differential amplifier having a non-inverting input terminal coupled to the first output terminal and an inverting input terminal coupled to the second output terminal, the differential amplifier configured to provide a first output signal on a third output terminal when a first voltage on the non-inverting input terminal is greater than a second voltage, on the inverting input terminal; and configured to provide a second output signal on the third output terminal when the first voltage on the non-inverting input terminal is greater than the second voltage on the inverting input terminal.

2. The comparator of claim 1 wherein the non-inverting input is coupled to the first output terminal and the inverting input is coupled to the second output terminal via an input buffer.

3. The comparator of claim 1, wherein the differential amplifier is configured to transition from providing the first output signal to providing the second output signal when the second voltage is at least a threshold greater than the first voltage and is configured to transition from providing the second output signal to providing the first output signal when the first voltage is at least the threshold greater than the second voltage.

4. The comparator of claim 1, the comparator further including:
a first capacitor having a seventh terminal coupled to seventh current handling terminal and an eighth terminal coupled to the fourteenth current handling terminal; and
a second capacitor having a ninth terminal coupled to eighth current handling terminal and a tenth terminal coupled to the sixteenth current, handling terminal.

5. The comparator as in claim 1 wherein, the first transistor, the second transistor, the third transistor, the fourth transistor, the fifth transistor, and the sixth transistor are p-channel transistors, and the seventh transistor and the eighth transistor are n-channel transistors.

6. The comparator of claim 1, wherein the first transistor, the second transistor; the third transistor, the fourth transistor, the fifth transistor, the sixth transistor, the seventh transistor, and the eighth transistor are field effect transistors.

7. The comparator of claim 1, the comparator further including:
a fourth current source having a seventh terminal coupled to the supply potential and an eighth terminal coupled to a first body connection of the first transistor and a second body connection of the second transistor;
a resistor having a ninth terminal coupled to the eighth terminal and a tenth terminal; and
a ninth transistor having a control terminal coupled to the first current handling terminal and the third current handling terminal, a seventeenth current handling terminal coupled to the tenth terminal and an eighteenth current handling terminal coupled to the reference potential.

8. The comparator of claim 7, wherein the ninth transistor is a field effect transistor.

9. The comparator of claim 8, further including:
a tenth transistor having a tenth control terminal coupled to the tenth terminal, a nineteenth current handling terminal coupled to the first input terminal and a twentieth current handling terminal coupled to the first control terminal;
a first diode having a first anode coupled to the tenth terminal and a first cathode coupled to the twentieth current handling terminal;
an eleventh transistor having an eleventh control terminal coupled to the tenth terminal, a twenty-first nineteenth current handling terminal coupled to the second input, terminal and a twenty-second current handling terminal couple to the second control terminal; and
a second diode having a second anode coupled to the tenth terminal and a second cathode coupled to the twenty-second current handling terminal.

10. An integrated circuit comprising:
a comparator, the comparator including:
a first transistor having a first control terminal coupled to a first input terminal, a first current handling terminal, a second current handling terminal and a first body connection;
a first current source adapted to be coupled between a supply potential and the first current handling terminal;
a second transistor having a second control terminal coupled to a second input terminal, a third current handling terminal coupled to the first current handling terminal, a fourth current handling terminal and a second body connection coupled to the first body connection;
a third transistor having a third control terminal coupled to the first input terminal, a fifth current handling terminal coupled to the second current handling terminal, and a sixth current handling terminal coupled to a first output terminal:
a fourth transistor having a fourth control terminal coupled to the second input terminal, a seventh current handling terminal coupled to the fourth current handling terminal, and an eighth current handling terminal coupled to a second output terminal;
a fifth transistor having a fifth control terminal, a ninth current handling terminal coupled to the second current handling terminal and a tenth handling terminal coupled to the first output terminal;
a sixth transistor having a sixth control terminal, an eleventh current handling terminal coupled to the fourth current handling terminal and a twelfth current handling terminal coupled to the second output, terminal;
a seventh transistor having a seventh control terminal coupled to the first input terminal, a thirteenth current handling terminal adapted to be coupled to the supply potential and a fourteenth current handling terminal coupled to the fifth control terminal;
an eighth transistor having an eighth control terminal coupled to the second input terminal, a fifteenth current handling terminal adapted to be coupled to the supply potential and a sixteenth current handling terminal coupled to the sixth control terminal;

a second current source having a third terminal coupled to the fifth control terminal and a fourth terminal coupled to a reference potential;

a third current source having a fifth terminal coupled to the sixth control terminal and a sixth terminal coupled to the reference potential;

a fourth current source having a seventh terminal coupled to the supply potential and an eighth terminal coupled to the first body connection of the first transistor and the second body connection of the second transistor;

a resistor having a ninth terminal coupled to the eighth terminal and a tenth terminal;

a ninth transistor having a control terminal coupled to the first current handling terminal and the third current handling terminal, a seventeenth current handling terminal coupled to the tenth terminal and an eighteenth current handling terminal coupled to the reference potential; and a differential amplifier having a non-inverting input terminal coupled to the first output terminal and an inverting input terminal coupled to the second output terminal, the differential amplifier configured to provide a first output signal on a third output terminal when a first voltage on the non-inverting input terminal is greater than a second, voltage on the inverting input terminal, and configured to provide a second output signal on the third output terminal when the first voltage on the non-inverting input terminal is greater than the second voltage on the inverting input terminal.

11. The integrated circuit of claim 10 wherein the non-inverting input is coupled to the first output terminal and the inverting input is coupled to the second output terminal via an input buffer.

12. The integrated circuit of claim 10, wherein the differential amplifier is configured to transition from providing the first output signal to providing the second output signal when the second voltage is at least a threshold greater than the first voltage and is configured to transition from providing the second output signal to providing the first output signal when the first voltage is at least the threshold greater than the second voltage.

13. The integrated circuit of claim 10, the comparator further including:
a first capacitor having a ninth terminal coupled to seventh current handling terminal and a tenth terminal coupled to the fourteenth current handling terminal; and
a second capacitor having a eleventh terminal coupled to eighth current handling terminal and a twelfth terminal coupled to the sixteenth current handling terminal.

14. The integrated circuit as in claim 10 wherein, the first transistor, the second transistor, the third transistor, the fourth transistor, the fifth transistor, and the sixth transistor are p-channel transistors, and the seventh transistor and the eighth transistor are n-channel transistors.

15. The integrated circuit of claim 10, wherein the first transistor, the second transistor, the third transistor, the fourth transistor, the fifth transistor, the sixth transistor, the seventh transistor, and the eighth transistor are field effect transistors.

16. The integrated circuit of claim 10, the comparator further including:
a tenth transistor having a tenth control terminal coupled to the tenth terminal, a nineteenth current handling terminal coupled to the first input terminal and a twentieth current handling terminal couple to the first control terminal;

a first diode having a first anode coupled to the tenth terminal and a first cathode coupled to the twentieth current handling terminal;
an eleventh transistor having an eleventh control terminal coupled to the tenth terminal, a twenty-first nineteenth current handling terminal coupled to the second input terminal and a twenty-second current handling terminal couple to the second control terminal; and
a second diode having a second anode coupled to the tenth terminal and a second cathode coupled to the twenty-second current handling terminal.

17. The integrated circuit of claim 16, wherein the ninth transistor is a field effect transistor.

18. The integrated circuit of claim 16, wherein the first diode is a first diode-connected transistor and the second diode is a second diode-connected transistor.

19. An integrated circuit comprising:
a comparator, the comparator including:
a first transistor having a first control terminal coupled to a first input terminal, a first current handling terminal, a second current handling terminal and a first body connection;
a first current source adapted to be coupled between a supply potential and the first current handling terminal;
a second transistor having a second control terminal coupled to a second input terminal, a third current handling terminal coupled to the first current handling terminal, a fourth current, handling terminal and a second body connection coupled to the first body connection;
a third transistor having a third control terminal coupled to the first input terminal, a fifth current handling terminal coupled to the second current handling terminal, and a sixth current handling terminal coupled to a first output terminal;
a fourth transistor having a fourth control terminal coupled to the second input terminal, a seventh current handling terminal coupled to the fourth current handling terminal, and an eighth current handling terminal coupled to a second output terminal;
a fifth transistor having a fifth control terminal, a ninth current handling terminal coupled to the second current handling terminal and a tenth handling terminal coupled to the first output terminal;
a sixth transistor having a sixth control terminal, an eleventh current handling terminal coupled to the fourth current handling terminal and a twelfth current handling terminal coupled to the second output terminal;
a seventh transistor having a seventh control terminal coupled to the first input terminal, a thirteenth current handling terminal adapted to be coupled to the supply potential and a fourteenth current handling terminal coupled to the fifth control terminal;
an eighth transistor having an eighth control terminal coupled to the second input terminal, a fifteenth current handling terminal adapted to be coupled to the supply potential and a sixteenth current handling terminal coupled to the sixth control terminal; and
a differential amplifier having a non-inverting input terminal coupled to the first output terminal and an inverting input terminal coupled to the second output terminal, wherein the differential amplifier is configured to transition from providing a first output signal to providing a second output signal when a first voltage on the first output terminal is at least a threshold greater than a second voltage on the second output terminal, and is configured to transition from providing the second output signal to providing the first output signal when the second voltage is at least the threshold greater than the first voltage.

20. The integrated circuit of claim 19 wherein the non-inverting input is coupled to the first output terminal and the inverting input is coupled to the second output terminal via an input buffer.

* * * * *